US010027048B2

(12) United States Patent
Ochi

(10) Patent No.: US 10,027,048 B2
(45) **Date of Patent: *Jul. 17, 2018**

(54) ELECTRICAL COMPONENT AND ELECTRONIC DEVICE

(71) Applicant: DENSO CORPORATION, Kariya, Aichi-pref. (JP)

(72) Inventor: Kenji Ochi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/617,083

(22) Filed: Jun. 8, 2017

(65) Prior Publication Data

US 2017/0358882 A1 Dec. 14, 2017

(30) Foreign Application Priority Data

Jun. 10, 2016 (JP) ................................ 2016-116411
May 25, 2017 (JP) ................................ 2017-103930

(51) Int. Cl.
*H05K 1/09* (2006.01)
*H01R 13/03* (2006.01)
*H01R 12/58* (2011.01)

(52) U.S. Cl.
CPC ........... *H01R 13/03* (2013.01); *H01R 12/585* (2013.01)

(58) Field of Classification Search
CPC ...... H05K 3/306; H05K 3/308; H01R 12/585; H01R 13/03
See application file for complete search history.

(56) References Cited

U.S. PATENT DOCUMENTS

2003/0078416 A1* 4/2003 Tor ....................... C07D 471/04 536/28.54
2003/0234063 A1* 12/2003 Sturgill ................... C23C 22/34 148/273
2004/0016363 A1* 1/2004 Phelps .................... C23C 18/52 106/1.17
2013/0004856 A1* 1/2013 Hosoe .................... H01G 9/016 429/245
2014/0102759 A1 4/2014 Schmidt et al.
2016/0201211 A1 7/2016 Ochi et al.
2017/0012377 A1 1/2017 Ochi
2017/0179628 A1* 6/2017 Bagung .................. H01R 13/03

FOREIGN PATENT DOCUMENTS

JP 2000-273684 A 10/2000
JP 2004-134301 A 4/2004

OTHER PUBLICATIONS

U.S. Appl. No. 15/617,082, filed Jun. 8, 2017, Ochi.

* cited by examiner

*Primary Examiner* — Steven T Sawyer
(74) *Attorney, Agent, or Firm* — Posz Law Group, PLC

(57) ABSTRACT

An electrical component includes a connection portion that is to be in contact with other electrical component and is to establish an electrical connection with the other electrical component. The connection portion includes a plating film that defines a surface of the connection portion. The plating film includes a metal as a main constituent and an aromatic compound that is dispersed in the plating film. The aromatic compound has pi-acceptability and causes ligand field splitting equal to or greater than that of 2,2'-bipyridyl in spectrochemical series. A content of the aromatic compound in the plating film is equal to or greater than 0.1 weight percent, in terms of carbon atoms, with respect to the metal of the plating film.

18 Claims, 11 Drawing Sheets

ELECTRICAL COMPONENT AND ELECTRONIC DEVICE

CROSS REFERENCE TO RELATED APPLICATIONS

This application is based on Japanese Patent Application No. 2016-116411 filed on Jun. 10, 2016 and Japanese Patent Application No. 2017-103930 filed on May 25, 2017, the disclosures of which are incorporated herein by reference.

TECHNICAL FIELD

The present disclosure relates to an electrical component and an electronic device including a connection portion that establishes an electrical connection by contact.

BACKGROUND

Conventionally, an electrical component including a connection portion that establishes an electrical connection by contact has been known, such as a terminal having elasticity, a connector including the terminal, and a substrate including a land. In such an electrical component, there is a possibility that a contact resistance is increased at the connection portion due to an oxidation of a metal surface. At the metal surface, electrons are localized like dangling bonds at a semiconductor surface. Oxygen molecule has two unpaired electrons. It is assumed that the oxygen molecule and the metal share the electrons and the oxygen molecule is adsorbed to the metal surface, and thus the metal surface is oxidized. In other words, the localization of the electrons forms a surface level at the metal surface, and the oxygen molecule having unpaired electrons is trapped by the surface level to oxidize the metal surface.

To manage the above possibility, it has been known to plate a surface of the connection portion by a noble metal such as gold. However, when the noble metal is worn (e.g., fretting wear) due to a relative displacement of the connection portion, that is, a sliding movement of the connection portion, the metal surface is exposed and oxidized. To avoid this situation, a thickness of the plating of the noble metal needs to be increased, and thus the cost is increased.

JP 2014-519157 A, which corresponds to US 2014/0102759 A1, discloses an electrical component to manage the above possibility without using the noble metal. An electrical connection element (i.e., the electrical component) has a connection portion including a core body (i.e., a base) and a cover layer formed at a surface of the core body. The cover layer includes a chemical reducing reagent (hereinafter, referred to as a reductant). The reductant is released from the cover layer as a result of the sliding movement and the released reductant reduces a metal oxide at the surface of the cover layer.

SUMMARY

In JP 2014-519157 A, when the reductant at the surface of the cover layer loses reducing efficiency, the metal at the surface of the cover layer is oxidized. As a result, it is difficult to restrict increase of the contact resistance caused by the oxidation for a long period of time.

The electrical connection by contact generally employs a restoring force of elastic deformation. For example, in the connection between the terminal having elasticity and the substrate having the land, the substrate receives a load caused by the restoring force of the elastic deformation of the terminal, as well as a load caused by a kinetic friction force between the terminal and the land. The load caused by the kinetic friction force is applied in a direction orthogonal to a direction in which the load caused by the restoring force of the elastic deformation is applied. When the load caused by the kinetic friction force is increased, the plating is scraped to generate scrapings or the substrate is distorted. Accordingly, the load caused by the kinetic friction force has an influence on the electrical component and the electronic device including the connection portion establishing the electrical connection by contact.

It is an object of the present disclosure to provide an electrical component and an electronic device capable of restricting increase of a contact resistance caused by oxidation for a long period of time, and reducing a kinetic friction force.

According to a first aspect of the present disclosure, an electrical component includes a connection portion that is to be in contact with other electrical component and is to establish an electrical connection with the other electrical component. The connection portion includes a plating film that defines a surface of the connection portion.

The plating film includes a metal as a main constituent and an aromatic compound dispersed in the plating film. The aromatic compound has pi-acceptability and causes ligand field splitting equal to or greater than that of 2,2'-bipyridyl in spectrochemical series. A content of the aromatic compound in the plating film is equal to or greater than 0.1 weight percent, in terms of carbon atoms, with respect to the metal of the plating film.

According to the first aspect of the present disclosure, the aromatic compound of the plating film has pi-acceptability and forms a pi-backbonding with a metal having a dangling bond. As a result, an oxidation of the metal at the surface of the connection portion is restricted. Since the pi-backbonding restricts the oxidation, increase of a contact resistance is restricted for a long period of time.

The aromatic compound gives self-lubricity to the plating film and reduces a kinetic friction force generated when the connection portion establishes the electrical connection by contact.

According to a second aspect of the present disclosure, an electronic device includes a first electrical component and a second electrical component. The first electrical component includes a first connection portion. The second electrical component includes a second connection portion that is in contact with the first connection portion and electrically connected to the first connection portion.

At least one of the first connection portion and the second connection portion includes a plating film that defines a contact surface between the first connection portion and the second connection portion. The plating film includes a metal as a main constituent and an aromatic compound dispersed in the plating film. The aromatic compound has pi-acceptability and causes ligand field splitting equal to or greater than that of 2,2'-bipyridyl in spectrochemical series. A content of the aromatic compound in the plating film is equal to or greater than 0.1 weight percent, in terms of carbon atoms, with respect to the metal of the plating film.

According to the second aspect of the present disclosure, effects similar to the electrical component of the first aspect of the present disclosure are achieved.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be described with reference to the drawings. In the following embodiments, portions functionally and/or structurally corresponding to each other will be designated with the same symbols. Hereinafter, a thickness direction of a print substrate is referred to as Z direction. A direction orthogonal to the Z direction is referred to as X direction. The X direction corresponds to a depth direction of an opening of an enclosure. A direction orthogonal to the Z direction and the X direction is referred to as Y direction. Unless otherwise noted, a plane shape extends along XY plane.

First Embodiment

First, a schematic structure of an electronic device according to the present embodiment will be described with reference to FIG. 1.

Figure 1:
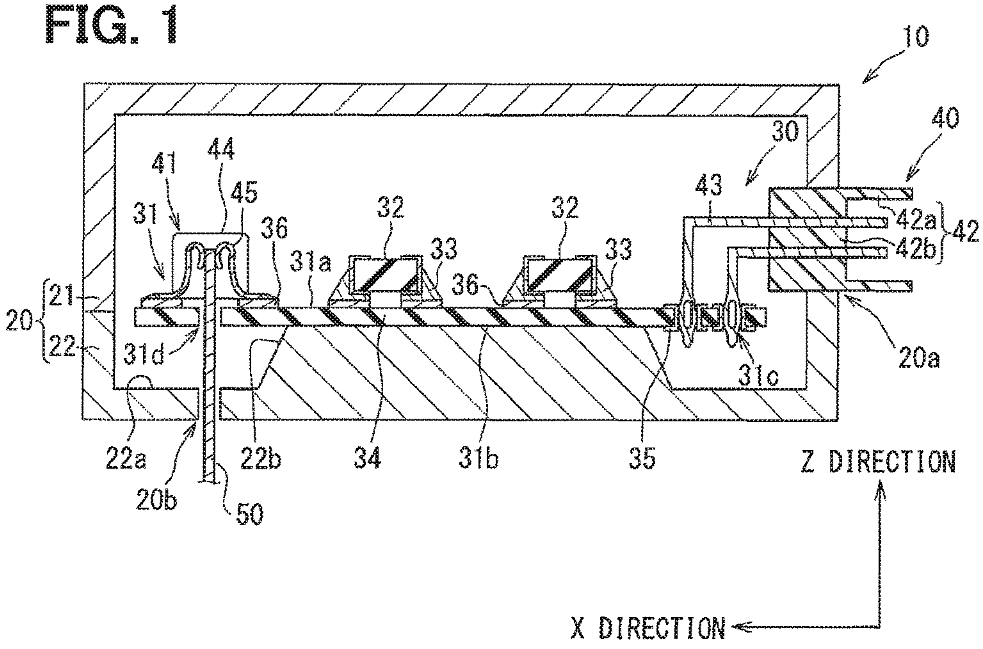
FIG. 1 is a cross-sectional view illustrating a schematic structure of an electronic device according to a first embodiment.

For example, an electronic device 10 shown in FIG. 1 is mounted to a vehicle. The electronic device 10 is an electronic control unit (ECU) controlling a vehicle. For example, the electronic device 10 is an engine ECU controlling an engine mounted to a vehicle.

The electronic device 10 includes an enclosure 20, a circuit board 30 and connectors 40 and 41.

The enclosure 20 accommodates the circuit board 30 to protect the circuit board 30. For example, the enclosure 20 is made of metal such as aluminum in order to improve radiation performance of heat generated in the circuit board 30. For example, the circuit board 30 is made of resin in order to reduce a weight of the electronic device 10.

In the present embodiment, the enclosure 20 includes two members divided in the Z direction, that is, a case 21 and a cover 22. The case 21 and the cover 22 are made of a material including aluminum. The enclosure 20 is provided by assembling the case 21 and the cover 22 in the Z direction. A method for assembling the case 21 and the cover 22 is not especially limited. Well known method such as screw fixing may be adopted.

The case 21 has a box shape and a top surface of the case 21 has an opening. A bottom surface of the case 21 has almost rectangular shape corresponding to the circuit board 30 that has flat and almost rectangular shape. The case 21 has four side surfaces and one of the side surfaces has an opening. The opening of the one of the side surfaces and the opening of the top surface of the case 21 communicate with each other.

The cover 22 defines an internal space of the enclosure 20 with the case 21. When the case 21 and the cover 22 are assembled, the cover 22 occludes the opening of the top surface of the case 21 and provides an opening 20*a*. The opening 20*a* is provided by the opening of the one of the side surfaces of the case 21 when the opening of the top surface of the case 21 is occluded by the cover 22.

The cover 22 has an opening 20*b* that penetrates a bottom surface of the cover 22 in the Z direction. An output terminal 50 that electrically connects the circuit board 30 to a motor, which is not illustrated, is inserted to the opening 20*b*.

The circuit board 30 includes a print substrate 31 and electronic components 32 mounted on the print substrate 31. The electronic components 32 are electrically connected to the print substrate 31 through solders 33. The circuit board 30 is accommodated in the internal space of the enclosure 20. The print substrate 31 has a front surface 31*a* and a rear surface 31*b*. The rear surface 31*b* is opposite to the front surface 31*a* in the Z direction. A thickness direction of the print substrate 31 corresponds to the Z direction. The print substrate 31 has a flat and almost rectangular shape. The print substrate 31, i.e., the circuit board 30 is fixed to the enclosure 20 by well-known method such as a screw fixing, an adhesion and the like.

In the present embodiment, the cover 22 has a shallow box shape. The cover 22 has a support 22*b* that protrudes from an inner bottom surface 22*a* toward the print substrate 31. The rear surface 31*b* of the print substrate 31 is supported by the support 22*b* and the print substrate 31 is fixed to the cover 22, i.e., the enclosure 20.

The print substrate 31 includes an insulation base 34 and wirings arranged on the insulation base 34. The insulation base 34 is made of an electrical insulation material such as resin. The wirings and the electronic components 32 form circuits. In FIG. 1, only lands 35 and 36 of the wirings of the print substrate 31 are illustrated. The lands 35 and 36 are electrodes for external connections.

The print substrate 31 has a through hole 31*c* that penetrates the print substrate 31 from the front surface 31*a* to the rear surface 31*b*. The land 35 is formed at a wall surface of the through hole 31*c*. The land 35 may be referred to as a through hole land. In the present embodiment, the land 35 is integrally formed at the wall surface of the through hole 31*c* and at portions of the front surface 31*a* and the rear surface 31*b* around the through hole 31*c*. A terminal 43 of the connector 40, which is described later, is pressed against the land 35 and is in contact with the land 35. For example, the land 35 is formed by conducting electroless copper plating and then conducting electrolytic copper plating.

The land 36 is formed on at least one of the front surface 31*a* and the rear surface 31*b* of the print substrate 31. The land 36 corresponds to an electrode to which the electronic components are soldered. In the present embodiment, multiple lands 36 are formed on the front surface 31*a*. The surface-mounted-type electronic components 32 are electrically connected to ones of the lands 36 through the solders 33. The surface-mounted-type connector 41 is electrically connected to another one of the land 36 through the solder 33. For example, the land 36 is formed by patterning copper foil affixed on a surface of the insulation base 34.

The connector 40 is disposed at one end side of the print substrate 31 in the X direction. A part of the connector 40 is exposed to outside through the opening 20*a* of the enclosure 20 and the remaining part of the connector 40 is accommodated in the internal space of the enclosure 20. The connector 40 includes a housing 42 and terminals 43.

The housing 42 is made of resin. The housing 42 includes a tube part 42*a* and an occluding part 42*b*. The tube part 42*a* has a tubular shape. The tube part 42*a* has an axis along the X direction. The occluding part 42*b* is communicated with the tube part 42*a* and occludes the tube part 42*a*. The occluding part 42*b* holds the terminals 43. In the present embodiment, the occluding part 42*b* occludes one end of the tube part 42*a*. Accordingly, the housing 42 has a tube shape with a bottom wall.

The terminals 43 are made of conductive materials. The terminals 43 electrically connect the circuits formed in the circuit board 30 to external devices. The terminals 43 are held by the occluding part 42*b*, for example, by a press-fitting or an insert molding. Although not illustrated, the terminals 43 are arranged in the Y direction, which is a width direction of the housing 42. In the present embodiment, since a large number of terminals 43 are provided, the terminals 43 are arranged in columns in the Z direction. The terminals 43 are press-fit terminals. Each of the terminals 43 has an almost L shape. Each of the terminals 43 is press-fitted into (i.e., pressed into) the through hole 31*c*. In other words, the through hole 31*c* receives the terminal 43. Each of the terminals 43 is pressed against the corresponding land 35.

As described above, the connector 41 is the surface mounted type connector. The connector 41 is connected to the land 35 through the solder 33. The connector 41 is accommodated in the internal space of the enclosure 20. The connector 41 includes a housing 44 and terminals 45. In the present embodiment, the connector 41 is disposed on the front surface 31*a* of the print substrate 31. As shown in FIG. 1, the connector 41 is disposed at the other end side of the print substrate 31 opposite to the connector 40 in the X direction.

The housing 44 is made of resin. The housing 44 holds the terminals 45. The terminals 45 are made of conductive materials. The terminals 45 are held by the housing 44 so that the terminals 45 conduct an elastic deformation. As shown in FIG. 1, the terminals 45 are provided in a pair to sandwich the output terminal 50 by a restoring force of the elastic deformation. The pair of terminals 45 is arranged in the X direction and sandwich the output terminal 50 in the X direction. A part of each terminal 45 between a point connected to the output terminal 50 and a point connected to the land 35 is held by the housing 44.

The print substrate 31 includes a through hole 31*d* that penetrates the print substrate 31 from the front surface 31*a* to the rear surface 31*b*. The through hole 31*d* is provided so that the output terminal 50 protrudes from the front surface 31*a*. The land 35 is not formed at a wall surface of the through hole 31*d*. The output terminal 50 penetrates the through hole 31*d* and sandwiched between the pair of terminals 45. That is, the terminals 45 are pressed against the output terminal 50.

Figure 2:
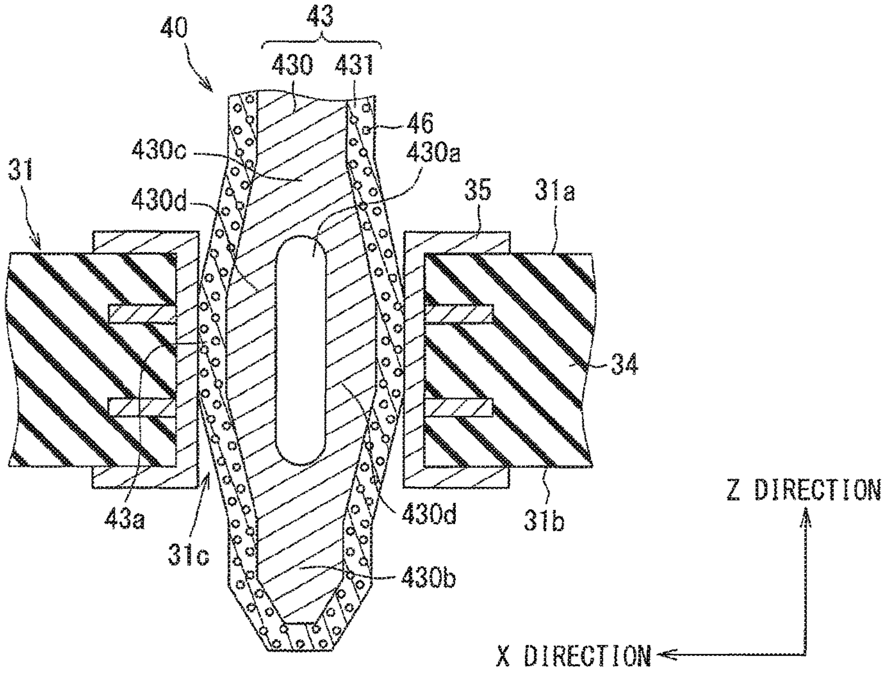
FIG. 2 is an enlarged cross-sectional view of a circumference of an electrical connection portion between a terminal of a connector and a land of a print substrate.
Figure 3:
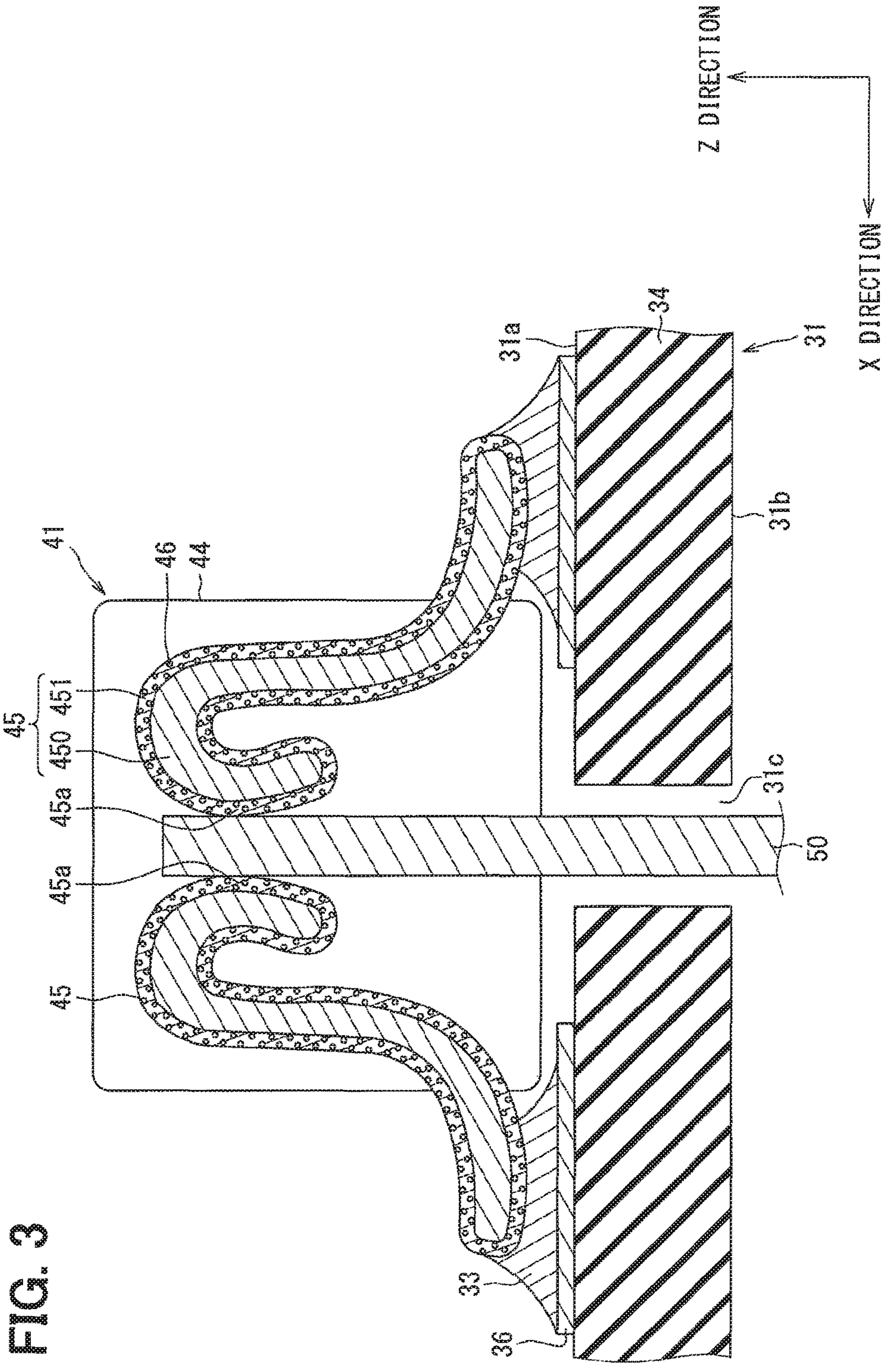
FIG. 3 is an enlarged cross-sectional view of a circumference of an electrical connection portion between the terminal of the connector and an output terminal connected to a motor.

Next, structures around electrical connection portions of the connectors 40 and 41 will be described with reference to FIG. 2 and FIG. 3. FIG. 2 and FIG. 3 schematically illustrate a dispersion of an aromatic compound 46, which will be described later.

In the present embodiment, as described above, the terminals 43 of the connector 40 are the press-fit terminals. As shown in FIG. 2, each of the terminals 43 is pressed into the through hole 31*c* of the print substrate 31 and held by the through hole 31*c*. The terminal 43 includes a base 430 and a plating film 431. The base 430 is made of metal. The plating film 431 covers the base 430. For example, the base 430 is made of copper or copper alloy. For example, phosphor bronze is employed as the copper alloy. The base 430 is formed by punching a metal plate of copper or copper alloy. The base 430 may be referred to as a host material.

The base 430 includes an opening 430*a*. The opening 430*a* is located at a part of the base 430 that is held in the through hole 31*c*. A thickness direction of the terminal 43 extends along the Y direction and the opening 430*a* penetrates the terminal 43 in the Y direction. The opening 430*a* extends along the Z direction, which is a longitudinal direction of the terminal 43. The base 430 further includes a head part 430*b*, a tail part 430*c* and body parts 430*d*.

The head part 430*b* is located between the opening 430*a* and an inserted head of the base 430. A width of the head part 430*b*, that is, a length of the head part 430*b* in the X direction is shorter than an inner diameter of the through hole 31*c*. The head part 430*b* leads the terminal 43 into the through hole 31*c*. Therefore, the head part 430*b* may be referred to as a lead part. The tail part 430*c* is located between the opening 430*a* and a tail of the base 430.

The base 430 includes a pair of body parts 430*d* divided by the opening 430*a*. The head part 430*b* couples the ends of the pair of body parts 430*d*, and the tail part 430*c* couples the opposite ends of the pair of body parts 430*d*. A distance in the X direction between external surfaces of the pair of body parts 430*d* is increased from the tail part 430*c* toward middle of the body parts 430*d* and decreased from the middle of the body parts 430*d* towards the head part 430*b*. The longest distance between the external surfaces of the pair of body parts 430*d* is defined as a width of the terminal 43. Before the terminal 43 is pressed into the through hole

31*c*, the width of the terminal 43 is greater than the inner diameter of the through hole 31*c*.

The plating film 431 covers at least an external surface of the base 430. The plating film 431 includes, as a main constituent, a metal that is capable of forming pi-backbonding (i.e., π-backbonding) with the aromatic compound 46 and capable of being formed into a film on the base 430. For example, the plating film 431 includes Ni, Cu, Ag or Co as the main constituent. In the present embodiment, the plating film 431 includes Cu.

The plating film 431 further includes the aromatic compound 46 having pi-acceptability, in addition to the metal as the main constituent (hereinafter, referred to as a main metal). A content of the aromatic compound 46 in the plating film 431 is equal to or greater than 0.1 weight percent (wt %), in terms of carbon atoms (C atoms), with respect to the main metal of the plating film 431. The content of the aromatic compound 46 is calculated by converting the sum of the wt % of the main metal and the wt % of the aromatic compound 46 into 100 wt % while keeping a ratio of the wt % of the main metal and the wt % of the aromatic compound 46.

The content of the aromatic compound 46 in the plating film 431 is equal to or smaller than 50 volume percent (vol %) of the main metal of the plating film 431. It is preferable that the content of the aromatic compound 46 in the plating film 431 is equal to or smaller than 15 wt %, in terms of C atoms, with respect to the main metal of the plating film 431.

When the content of the aromatic compound 46 is greater than 50 vol %, there is a possibility that associations of metals in the plating film 431 are inhibited and conductive paths in the plating film 431 are disconnected. In this case, the plating film 431 shows high insulation property.

For example, when the main metal of the plating film 431 is copper and the aromatic compound 46 is 1,10-phenanthroline, and the content of the aromatic compound 46 is greater than 15 wt %, in terms of C atoms, with respect to the main metal of the plating film 431, self-sustainability of the plating film 431 is inhibited and exfoliation of the plating film 431 is likely to occur. Accordingly, it is preferable that the content of the aromatic compound 46 in the plating film 431 is equal to or smaller than 15 wt %, in terms of C atoms, with respect to the main metal of the plating film 431.

In the plating film 431, the aromatic compound 46 is dispersed in the main metal of the plating film 431. The plating film 431 is formed by adding and dissolving the aromatic compound 46 in a plating bath and conducting plating of the base 430 in the plating bath.

The above described terminal 43 has elasticity. When the terminal 43 is inserted into the through hole 31*c*, the terminal 43 is deformed such that the pair of body parts 430*d* approach with each other and restoring forces of the body parts 430*d* are applied to the wall surfaces of the through hole 31*c*. As such, the plating film 431, which is formed on the external surface of the body part 430*d*, is pressed against the land 35 on the wall surface of the through hole 31*c*.

Accordingly, the terminal 43 has a connection portion 43*a* that is in contact with the land 35 and is electrically connected to the land 35. In other words, the connection portion 43*a* establishes the electrical connection between the terminal 43 and the land 35 by the contact between the terminal 43 and the land 35. The connection portion 43*a* includes the body parts 430*d* and the plating film 431. In the print substrate 31, the land 35 corresponds to a connection portion that is connected to the terminal 43. That is, one of the print substrate 31 having the land 35 and the connector 40 having the terminal 43 corresponds to a first electrical component having a first connection portion, and the other one corresponds to a second electrical component having a second connection portion. The terminal 43 is a pressing connection portion and the land 35 is a pressed connection portion.

The terminal 43 may include multiple layers of plating films including the plating film 431. In this case, an outermost layer of the multiple layers corresponds to the plating film 431 and the other layers of plating do not include the aromatic compound 46.

As shown in FIG. 3, each of the terminals 45 of the connector 41 includes a base 450 and a plating film 451. The base 450 is made of metal. The plating film 451 covers the base 450. For example, the base 450 is made of copper or copper alloy. The base 450 is fixed to the land 36 through the solder 33 so that the base 450 conducts elastic deformation in the X direction. The bases 450 are provided in a pair to sandwich the output terminal 50 by a restoring force of the elastic deformation. The pair of bases 450 is arranged in the X direction to sandwich the output terminal 50 in the X direction. The pair of bases 450 (i.e., the terminals 45) are line-symmetrically arranged.

The plating film 451 has a configuration similar to the plating film 431. That is, the plating film 451 includes, as a main constituent, a metal that is capable of forming pi-backbonding with the aromatic compound 46 and capable of being formed into a film on the base 450. For example, the plating film 451 includes Ni, Cu, Ag or Co as the main constituent. In the present embodiment, the plating film 451 includes Cu.

The plating film 451 further includes the aromatic compound 46 having pi-acceptability, in addition to the metal as the main constituent. The content of the aromatic compound 46 in the plating film 451 is equal to or greater than 0.1 wt %, in terms of C atoms, with respect to the main metal of the plating film 451. In the plating film 451, the aromatic compound 46 is dispersed in the main metal of the plating film 451. The plating film 451 is also formed by adding and dissolving the aromatic compound 46 in the plating bath and conducting plating of the base 450 in the plating bath.

The above described terminals 45 also have elasticity. When the output terminal 50 is inserted between the pair of terminals 45, each of the terminals 45 is deformed in the X direction. As a result, a distance between the pair of terminals 45 is increased and the restoring forces of the elastic deformation of the terminals 45 are applied to the output terminal 50 from both sides in the X direction. The plating film 451, which is formed on the surface of the terminal 45, is pressed against the output terminal 50. Accordingly, the terminal 45 has a connection portion 45*a* that is in contact with the output terminal 50 and is electrically connected to the output terminal 50. In other words, the connection portion 45*a* establishes the electrical connection between the terminal 45 and the output terminal 50 by the contact between the terminal 45 and the output terminal 50. The connection portion 45*a* includes the base 450 and the plating film 451. A portion of the output terminal 50 that is in contact with the terminals 45 corresponds to a connection portion of the output terminal 50 that is in contact with the terminals 45. That is, one of the connector 41 having terminals 45 and the output terminal 50 corresponds to a first electrical component having a first connection portion and the other one corresponds to a second electrical component having a second connection portion. The terminals 45 are pressing connection portions and the output terminal 50 is a pressed connection portions. The connection portions 43*a* and 45*a* correspond to a connection portion having plating films 431 and 451 including the aromatic compound 46.

The terminal 45 may include multiple layers of plating films including the plating film 451. In this case, an outermost layer of the multiple layers corresponds to the plating film 451 and the other layers of plating do not include the aromatic compound 46.

The aromatic compound 46 is a molecule that has aromaticity and pi-acceptability causing ligand field splitting equal to or greater than 2,2'-bipyridyl in spectrochemical series. The plating films 431 and 451 include such an aromatic compound 46 so that the content of the aromatic compound 46 in each of the plating films 431 and 451 is equal to or greater than 0.1 wt %, in terms of C atoms, with respect to the main metal of each of the plating films 431 and 451. Therefore, the aromatic compound 46 restricts the oxidation of the surface of the plating films 431 and 451, that is, the oxidation of the metal surface is restricted. Also, the aromatic compound 46 gives self-lubricity to the plating films 431 and 451.

The aromatic compound 46 has large pi-acceptability. The pi-acceptability may be referred to as pi-acidity. A degree of ligand field splitting corresponds to an energy difference between split d-orbitals. The aromatic compound 46 accepts electrons in an empty pi-orbital ($\pi$-orbital) of the aromatic compound 46 and forms back-donation-pi-bonding (i.e., pi-backbonding) with a metal. Therefore, the aromatic compound 46 may be referred to as pi-acceptor ligand. The aromatic compound 46 coordinates to the metal to form a metal complex. The pi-acceptability is proportionate to the degree of ligand field splitting. Hereinafter, well known spectrochemical series will be described. In the following example, CO has the largest ligand field splitting.

$$I^- < Br^- < Cl^- < OH^- < H_2O < py < NH_3 < en < bpy < phen < NO_2^- < PPh_3 < CN^- < CO$$

py corresponds to pyridine, en corresponds to ethylene diamine, bpy corresponds to 2,2'-bipyridyl, phen corresponds to 1,10-phenanthroline and $PPh_3$ corresponds to triphenylphosphine. Hereinafter, 2,2'-bipyridyl is expressed by bpy and 1,10-phenanthroline is expressed by phen.

Figure 4:
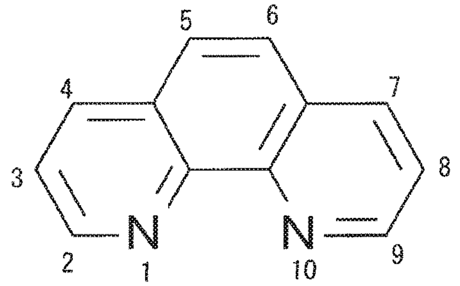
FIG. 4 is a diagram illustrating one example of an aromatic compound.
Figure 5:
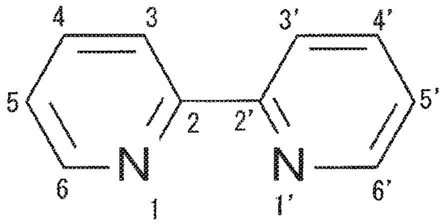
FIG. 5 is a diagram illustrating one example of the aromatic compound.
Figure 6:
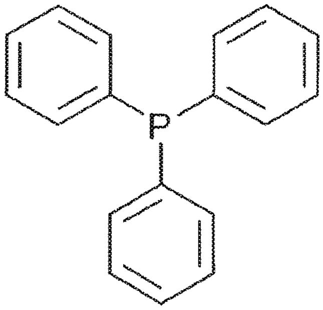
FIG. 6 is a diagram illustrating one example of the aromatic compound.

For example, as the aromatic compound 46, phen, phen derivatives, bpy, bpy derivatives, and phenylphosphines such as $PPh_3$ or diphenylphosphine are employed. The phen is illustrated in FIG. 4, the bpy is illustrated in FIG. 5, and the $PPh_3$ is illustrated in FIG. 6. The plating films 431 and 451 include at least one kind of aromatic compounds. For example, the plating films 431 and 451 may include two or more kinds of aromatic compounds. For example, the plating films 431 and 451 may include two kinds of phen derivatives. Also, the plating films 431 and 451 may include phen and phen derivatives. Furthermore, the plating films 431 and 451 may include only phen.

Each of phen, phen derivatives, bpy and bpy derivatives contains a nitrogen atom having lone pair of electrons. Each of phen, phen derivatives, bpy and bpy derivatives is a multidentate ligand containing two nitrogen atoms having lone pair. Each of phen, phen derivatives, bpy and bpy derivatives is a pi-conjugated ligand. Each of phen, phen derivatives, bpy and bpy derivatives is a heterocyclic compound. Each of phen, phen derivatives, bpy and bpy derivatives is a polycyclic compound containing multiple heterocyclic rings.

In FIG. 4 and FIG. 5, positional numbers are shown. In phen, hydrogen atoms are combined with carbon atoms at 2 to 9 positions. phen derivatives include a molecule having similar structure to phen. For example, phen derivatives include a molecule containing other functional group, instead of hydrogen atom, combined with at least one of the carbon atoms at 2 to 9 positions. That is, phen derivatives correspond to phen whose hydrogen atom is substituted by other functional group. In bpy, hydrogen atoms are combined with carbon atoms at 3, 3', 4, 4', 5, 5', 6, and 6' positions. bpy derivatives include a molecule having similar structure to bpy. For example, bpy derivatives include a molecule containing other functional group, instead of hydrogen atom, combined with carbon atoms at 4, 4', 5, 5', 6 and 6' positions.

Figure 7:
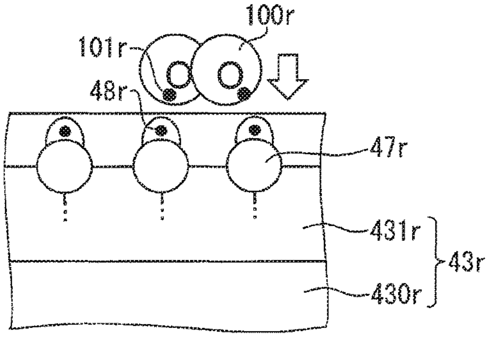
FIG. 7 is a diagram illustrating a reference example.
Figure 8:
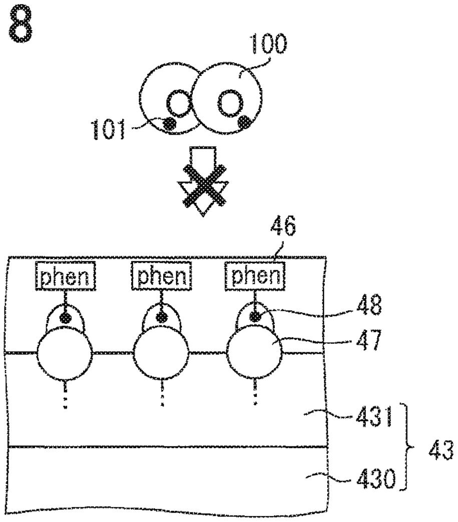
FIG. 8 is a diagram illustrating effects of the first embodiment.
Figure 9:
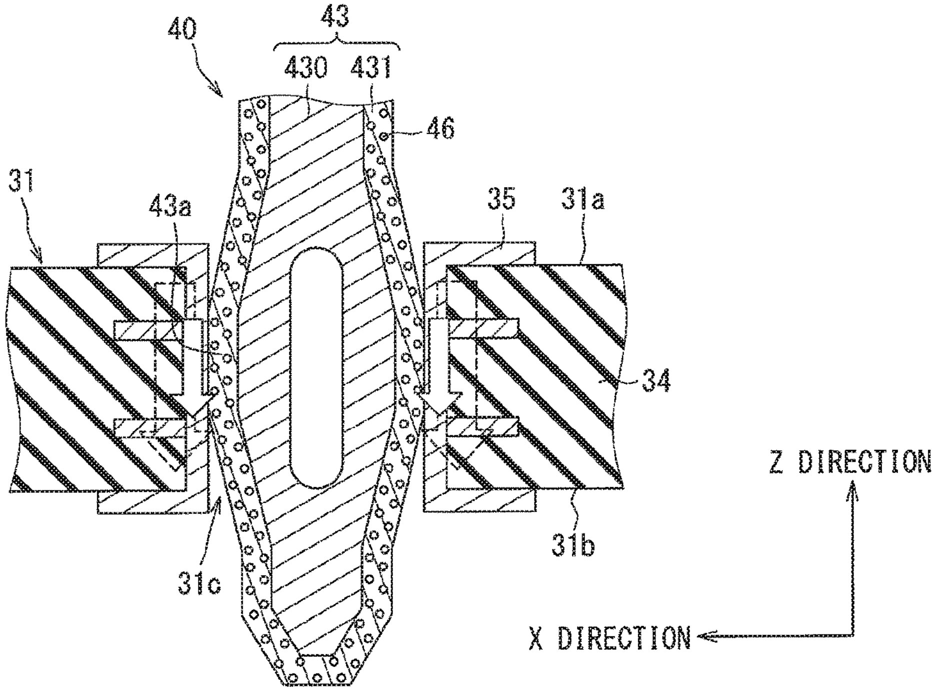
FIG. 9 is a cross-sectional view illustrating effects of the first embodiment.
Figure 10:
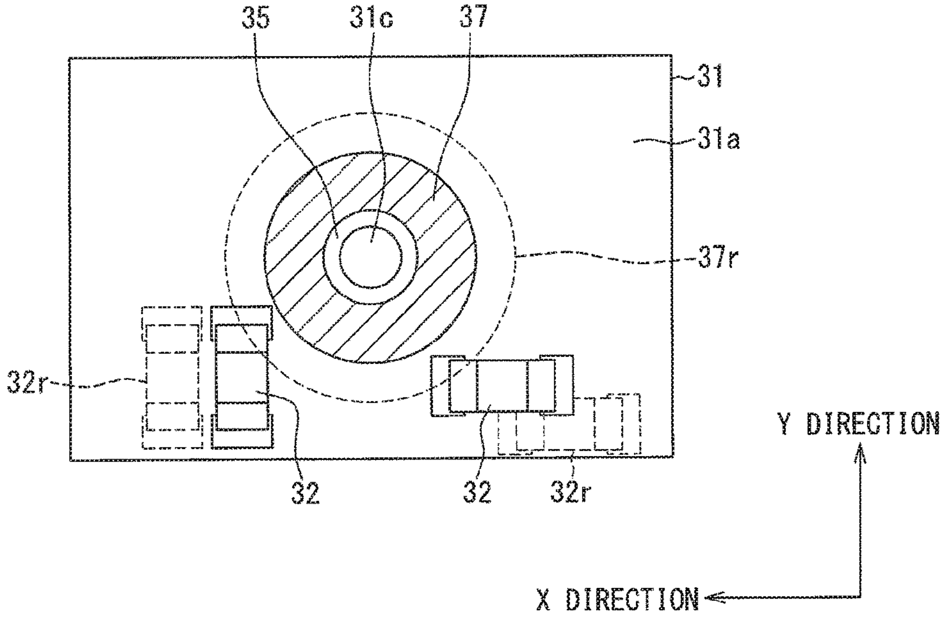
FIG. 10 is a plan view illustrating effects of the first embodiment.
Figure 11:
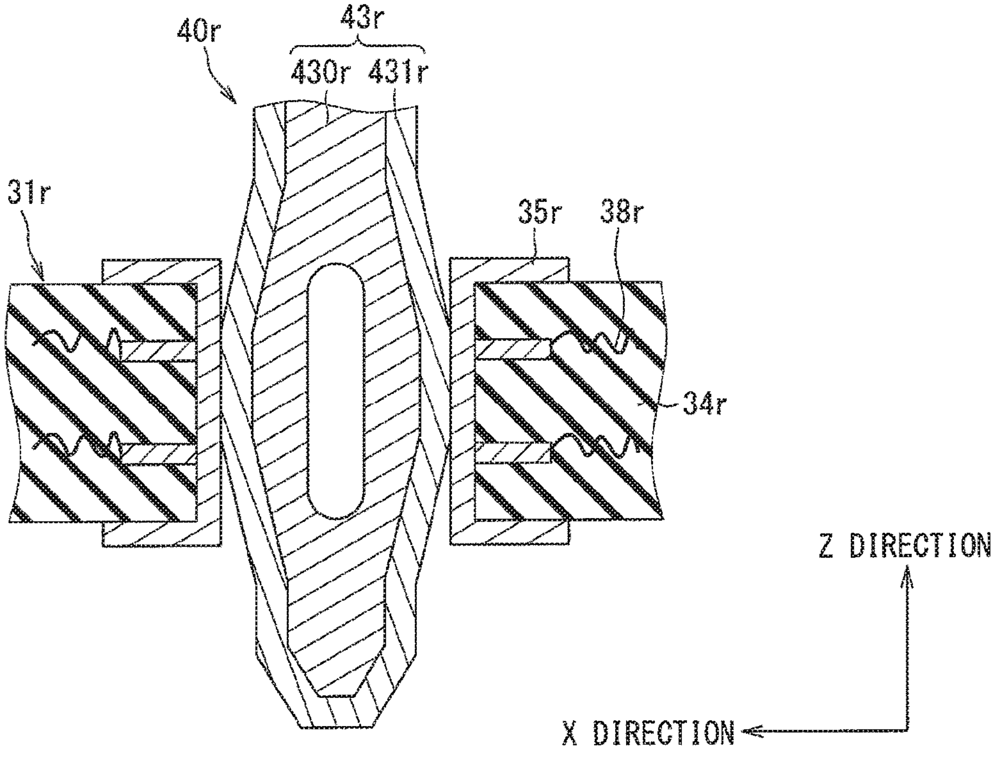
FIG. 11 is a cross-sectional view illustrating a reference example.

Next, effects of the connectors 40, 41 (i.e., electrical components) and the electronic device 10 will be described with reference to FIG. 7 to FIG. 12. FIG. 7 describes a reference example. In FIG. 7 and FIG. 8, metal atoms, dangling bonds, an oxygen molecule and unpaired electrons are schematically illustrated. Crystal structures of the metal atoms are not especially limited. In FIG. 8, the terminal 43 is illustrated as one example. The structure of FIG. 7 corresponds to FIG. 8. Although FIG. 10 is a plan view, a non-mount region 37, which will be described later, is hatched for clarification. FIG. 11 describes a reference example. In the reference examples, elements that are common or relative to the elements of the present embodiment will be designated by symbols adding "r" to the symbols of the present embodiment.

In the reference example shown in FIG. 7, a terminal 43*r* includes a base 430*r* and a plating film 431*r*. The plating film 431*r* of the reference example does not include the aromatic compound. In this structure, a surface of the plating film 431*r* corresponds to a metal surface of the terminal 43*r*. Electrons are localized at the surface of the plating film 431*r* like dangling bonds at a semiconductor surface. Hereinafter, the electrons localized at the metal surface are referred to as dangling bonds at the metal surface. As shown in FIG. 7, the metal atom 47*r* is located at the surface of the plating film 431*r*, and the metal atom 47 has a dangling bond 48*r*.

As shown in FIG. 7, an oxygen molecule 100 has two unpaired electrons 100*a*. It is assumed that unpaired electrons 100*a* and the dangling bonds 48*r* are shared by the oxygen molecule 100 and the metal atom 47, and the oxygen molecule 100 is adsorbed to the metal surface to oxidize the metal surface. In other words, the localization of the electrons forms a surface level at the metal surface, and thus the oxygen molecule 100 having unpaired electron 100*a* is trapped by the surface level to oxidize the metal surface. Accordingly, in the reference example corresponding to a conventional structure, the surface of the terminal 43 is oxidized.

As shown in FIG. 8, in the present embodiment, the terminal 43 includes the base 430 and the plating film 431. Similarly to the reference example, the surface of the plating film 431 corresponds to the metal surface of the terminal 43. As described above, the plating film 431 includes the aromatic compound 46 having pi-acceptability. In the example shown in FIG. 8, phen is dispersed as the aromatic compound 46.

As described above, the aromatic compound 46 accepts electrons in the empty pi-orbital of the aromatic compound 46 and forms pi-backbonding with a metal. The aromatic compound 46 is a molecule that has large pi-acceptability causes ligand field splitting equal to or greater than bpy in spectrochemical series. An energy level of the empty pi-orbital of the aromatic compound 46 is close to an energy level of an occupied d-orbital of the metal. Therefore, the pi-orbital and the d-orbital interact with each other and the electrons are delocalized from the metal to the aromatic compound 46. That is, the aromatic compound 46 forms pi-backbonding with the metal atom 47 (e.g., copper atom) of the plating film 431. A coordinating atom of the aromatic compound 46 has lone pair of electrons. A sigma-orbital (i.e., σ-orbital) of the coordinating atom and the empty orbital of the metal (e.g., d-orbital) interact with each other to form a sigma bond (a bond).

Accordingly, in the present embodiment, the aromatic compound 46 forms pi-backbonding with the metal atom 47 having the dangling bond 48. The content of the aromatic compound 46 in the plating film 431 is equal to or greater than 0.1 wt %, in terms of C atoms, with respect to the main metal of the plating film 431 and sufficient content of the aromatic compound 46 is dispersed and provided around the metal surface of the plating film 431. In the terminal 43, the dangling bonds at the metal surface are reduced or removed. That is, the oxidation of the metal surface is restricted in the terminal 43. Similar effects are achieved in the terminal 45.

In the case of employing a reductant, when the reductant loses reducing efficiency, the oxidation is proceeded. On the other hand, in the present embodiment, the aromatic compound 46 is combined with the metal atom 47 having the dangling bond 48 and restricts the oxidation of the metal surface. In the present embodiment, the oxidation is restricted as far as the bond between the aromatic compound 46 and the metal atom 47 is sustained. As described above, the aromatic compound 46 coordinates to the metal atom 47 via pi-backbonding in addition to sigma bonding. Therefore, increase of the contact resistance is restricted for longer period of time than the conventional structure.

Since the plating film does not include a noble metal such as gold, the oxidation of the metal surface is restricted cheaply.

Furthermore, in the present embodiment, the plating film 431 includes the aromatic compound 46, the content of which is equal to or greater than 0.1 wt %, in terms of C atoms, with respect to the main metal of the plating film 431. As a result, the plating film 431 has self-lubricity. When the terminal 43 is inserted (i.e., pressed) into the through hole 31*c*, load of assembling caused by a kinetic friction force between the terminal 43 and the land 35 is decreased, as shown by white arrows of FIG. 9. Especially in the press-fit terminal causing large load of assembling, the present embodiment is efficient. In FIG. 9, load of assembling in the reference example without the aromatic compound 46 is shown by broken arrows. The load of assembling caused by the kinetic friction force may be referred to as insertion load.

Accordingly, the aromatic compound 46 reduces the load of assembling caused by the kinetic friction force. Therefore, the aromatic compound 46 restricts that the plating film 431 and the plating film of the land 35 are scraped to generate scrapings.

In the terminal 43 (i.e., press-fit terminal) that is pressed into the through hole 31*c*, the load of assembling caused by the kinetic friction force is applied in the Z direction, that is, in a direction bending the print substrate 31. In the present embodiment, the load of assembling is reduced, and thus distortion of the print substrate 31 is reduced in the assembling.

Since the distortion of the print substrate 31 is reduced, a non-mount region 37 around the land 35, at which the electronic components 32 are not mounted, is decreased as shown in, for example, FIG. 10. That is, the electronic components 32 may be mounted near the land 35. In FIG. 10, the non-mount region 37*r* and the electronic components 32*r* are shown by broken lines as the reference example without the aromatic compound 46. The non-mount region 37*r* is decreased compared to the non-mount region 37*r* of the reference example, which is shown by the broken line. Therefore, the print substrate 31 is miniaturized. Also, solder crack is less likely to occur in the solder 33 connecting the electronic components 32 and the lands 36.

As shown in the reference example of FIG. 11, when the load of assembling caused by the kinetic friction force is large, there is a possibility that cracks 38 occur in an inner layer of the print substrate 31*r*. In other words, there is a possibility that blanching occurs in the print substrate 31*r*. In the present embodiment, the load of assembling caused by the kinetic friction force is reduced and the cracks in the inner layer are restricted.

Since the terminal 45 also includes the plating film 451 including the aromatic compound 46, similar effects to the terminal 43 are achieved. In the terminal 45, when the kinetic friction force is reduced, generation of the scrapings of the plating film 451 is restricted. Also, cracks are restricted in the solder 33 fixing the terminal 45 to the land 36. When the output terminal 50 includes a non-illustrated plating film, the aromatic compound 46 restricts that the plating film of the output terminal 50 is scraped to generate the scrapings.

It is preferable to employ polycyclic compound containing multiple aromatic rings as the aromatic compound 46. In this case, the self-lubricity of the plating films 431 and 451 are increased than monocyclic compound. That is, the kinetic friction force is further decreased. The self-lubricity is achieved with a small amount of the aromatic compound, compared to the monocyclic compound. For example, a heterocyclic compound may be employed as the polycyclic compound.

It is more preferable that the aromatic compound 46 includes at least one of phen and phen derivatives, which are the heterocyclic compounds. Since phen is a compound having longer conjugation and higher flatness than bpy, phen further increases self-lubricity. Furthermore, since phen is soluble in water, flexibility of manufacturing is increased.

It is preferable to employ heterocyclic compound containing an electron withdrawing group as the aromatic compound 46. For example, it is preferable to employ phen derivative in which the electron withdrawing group is combined with at least one of the atom of phen at 2 to 9 positions. When the hydrogen atom is substituted by the electron withdrawing group, the pi-acceptability is increased due to the electron withdrawing characteristics. Namely, the dangling bonds of the metal are withdrawn by phen. As such, bond strength is increased. Therefore, the increase of the contact resistance is restricted for a long period of time even under high temperature. That is, heat resistance is increased and the electrical component and the electronic device may be employed in broader temperature range. For example, the electron withdrawing group includes nitro group, aldehyde group, carboxy group and cyano group.

Similarly, bpy increases heat resistance. Specifically, it is preferable to employ bpy derivative in which the electron withdrawing group is combined with at least one of the atoms of bpy at 3 to 6 and 3' to 6' positions. As a result, the pi-acceptability is increased and the heat resistance is increased.

In the present embodiment, examples are described in which the terminals 43 and 45 of the connectors 40 and 41 have the plating films 431 and 451 including aromatic compound 46. However, the land 35 and the output terminal 50, to which the terminals 43 and 45 are connected, may have the plating film including the aromatic compound and being in contact with the terminals 43 and 45.

Next, specific examples will be described.

Example 1

Figure 12:
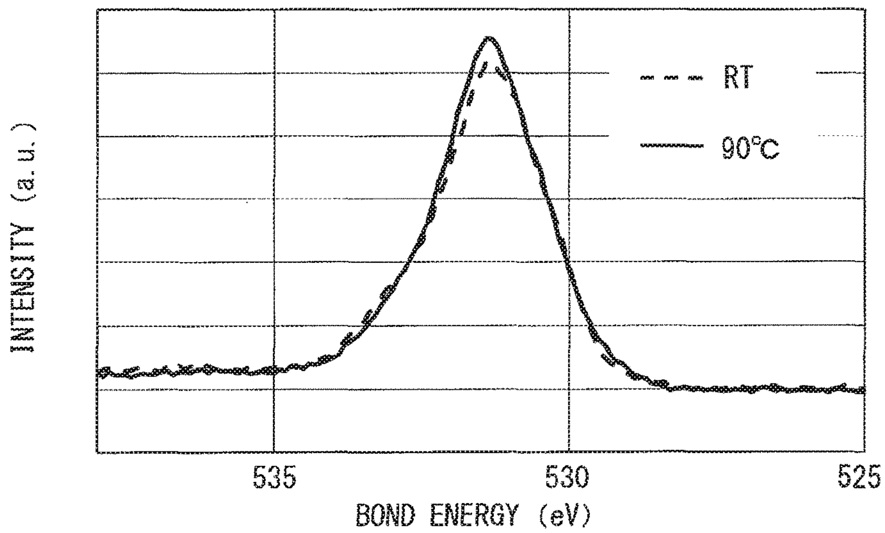
FIG. 12 is a diagram illustrating measurement results of XPS in an example 1.

A relationship between the presence of the aromatic compound 46 and the oxidation of the metal surface is examined. First, a base including phosphor bronze and having a flat plate shape is prepared. A size of the base is 20 millimeters×20 millimeters. phen of the aromatic compound 46 and an additive reagent are added and stirred in a plating bath mainly including copper. The plating film is formed at the surface of the base in the plating bath to make a test piece. The content of the aromatic compound 46 in the plating film is equal to or greater than 0.1 wt %, in terms of C atoms, with respect to copper (e.g., 0.5 to 9 wt %). The test piece is analyzed by X-ray photoelectron spectroscopy (XPS) at room temperature (e.g., 25 degrees Celsius). The test piece is heated on a hot plate and a temperature of the test piece is kept at 90 degrees Celsius for 3 hours. The test piece after 3 hours of heating is analyzed by XPS. The results are shown in FIG. 12. In FIG. 12, a broken line indicates a result at room temperature, and a solid line indicates a result at 90 degrees Celsius.

Figure 13:
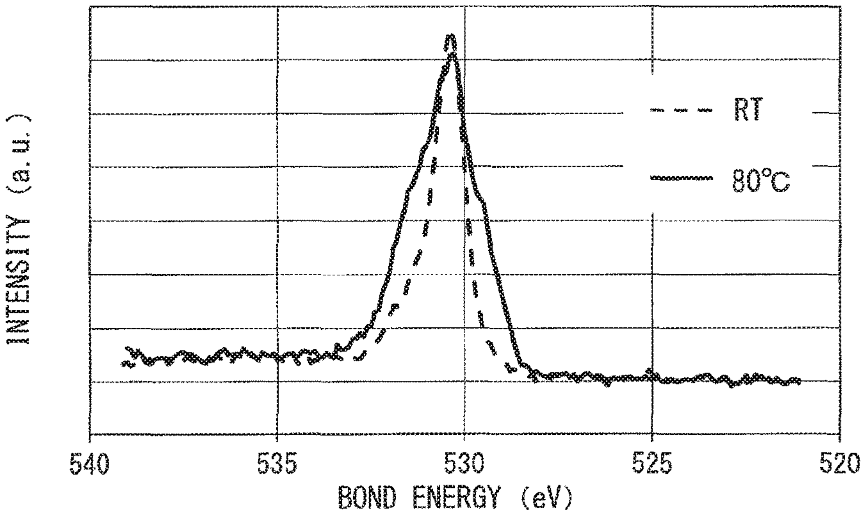
FIG. 13 is a diagram illustrating measurement results of XPS in a comparative example 1.

As a comparative example 1, a test piece that does not include the aromatic compound 46 (i.e., phen) in the plating film is made. The test piece of the comparative example 1 is analyzed by XPS at room temperature and 80 degrees Celsius. The results are shown in FIG. 13. In FIG. 13, a broken line indicates a result at room temperature, and a solid line indicates a result at 80 degrees Celsius.

Copper II oxide (CuO) exhibits a peak at 529.5 eV, and copper I oxide ($Cu_2O$) exhibits a peak at 530.4 eV. In the example 1, as shown in FIG. 12, an intensity of the peak at 529.5 eV is almost the same at room temperature and at 90 degrees Celsius. Also, an intensity of the peak at 530.5 eV is almost the same at room temperature and at 90 degrees Celsius. Therefore, in the example 1, the oxidation of the metal surface is restricted.

On the other hand, in the comparative example 1, even though the test piece is heated at 80 degrees Celsius, which is lower than the example 1, as shown in FIG. 13, a square measure of a band having a peak at 529.5 eV is increased at room temperature. At 80 degrees Celsius, shoulders are observed in the perk at 530.5 eV. Therefore, in the comparative example 1, in which the plating film does not include the aromatic compound 46, the oxidation of the metal surface is proceeded. The similar results are obtained with bpy.

Example 2

Effects of substituted group and heat resistance are examined.

Figure 14:
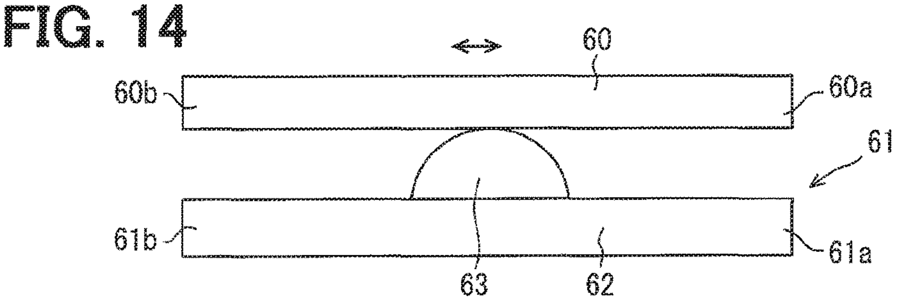
FIG. 14 is a diagram illustrating an examining method in an example 2.

First, as shown in FIG. 14, a first member 60 and a second member 61 are prepared. The first member 60 is made of a plate including phosphor bronze and has a size of 20 millimeters×20 millimeters. The first member 60 is made by adding and stirring the aromatic compound 46 and additive reagents in a plating bath mainly including copper and forming the plating film at the surface of the plate in the plating bath. The content of the aromatic compound 46 in the plating film is equal to or greater than 0.1 wt %, in terms of C atoms, with respect to copper. A metal member including a plate portion 62 and a protrusion portion 63 is prepared. The plate portion 62 includes phosphor bronze and has a size of 20 millimeters×20 millimeters. The protrusion portion 63 is formed near a center of a facing surface of the plate portion 62 facing the first member 60. A radius of the protrusion portion 63 is set to be 1 millimeter. The second member 61 is formed by forming the plating film on the surface of the metal member, similarly to the first member 60.

As shown in FIG. 14, the first member 60 is laminated above the surface of the plate portion 62 on which the protrusion portion 63 is formed so that the first member 60 almost coincides with the plate portion 62 in the projection view from the thickness direction. A direction along which the first member 60 and the second member 61 are laminated is referred to as a lamination direction. Then, the first member 60 and the second member 61 are relatively slid in a direction orthogonal to the lamination direction, which is shown by an arrow in FIG. 14, while applying a predetermined load (e.g., 3N) in the lamination direction from a side of the first member 60. Multiple distances are set as a distance of reciprocating movement of one sliding operation, that is, a distance that the first member 60 and the second member 61 moves in one sliding operation. In the following FIG. 15 to FIG. 17, the distance of one sliding operation is set to be 50 μm. Even when the distance is changed, similar results are obtained.

Contact resistances are measured in every one sliding operation. In the measuring the contact resistances, measurement terminals are attached to one end 60*a* of facing two ends of the first member 60 and the other end 60*b* of the first member 60. Also, measurement terminals are attached to one end 61*a* of facing two ends of the plate portion 62 of the second member 61 and the other end 61*b* of the plate portion 62 of the second member 61. When a direction in which the ends 60*a* and 60*b* face with each other is referred to as a first direction, the second member 61 is disposed so that the ends 61*a* and 61*b* face with each other in the first direction. In the first direction, the ends 60*a* and 61*a* are located at the same end side and the ends 60*b* and 61*b* are located at the same end side. The contact resistance of an energizing path between the end 60*a* of the first member 60 and the end 61*b* of the second member 61 is measured so that the protrusion portion 63 is sandwiched therebetween. The contact resistance of an energizing path between the end 60*b* of the first member 60 and the end 61*a* of the second member 61 is measured so that the protrusion portion 63 is sandwiched therebetween.

As the aromatic compound 46, a phen derivative containing nitro group ($NO_2$) at 5-position and a phen derivative containing aldehyde group (CHO) at 2-position are employed. The measurement of the contact resistance is conducted at room temperature (e.g., 25 degrees Celsius) and at 125 degrees Celsius. As a comparative example 2, similar sliding experiments are conducted with the first member and the second member plated with gold, instead of the plating film including the aromatic compound 46.

Figure 15:
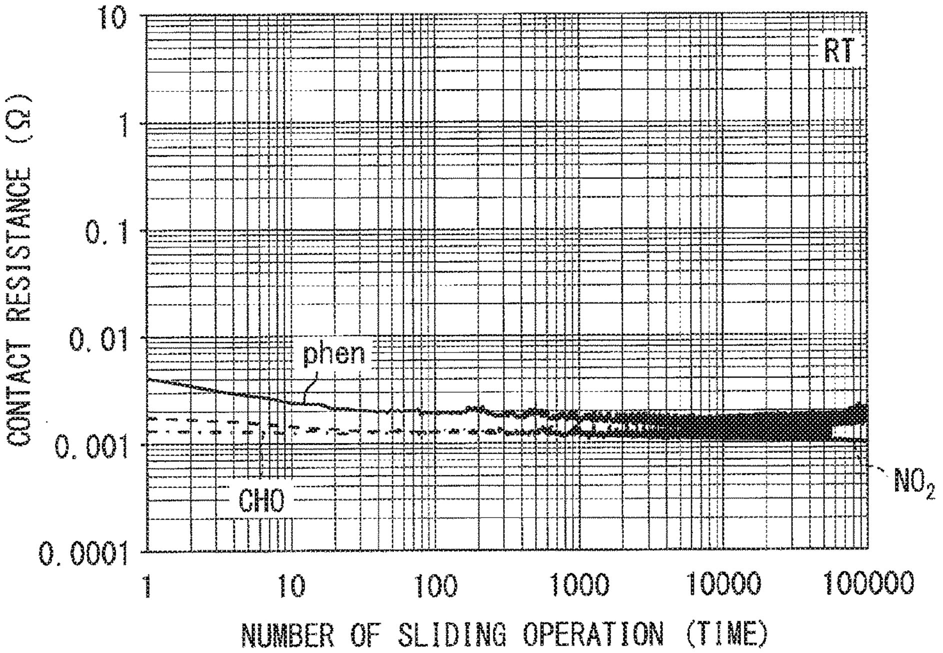
FIG. 15 is a diagram illustrating a relationship between the number of sliding operations and a contact resistance at room temperature in the example 2.
Figure 16:
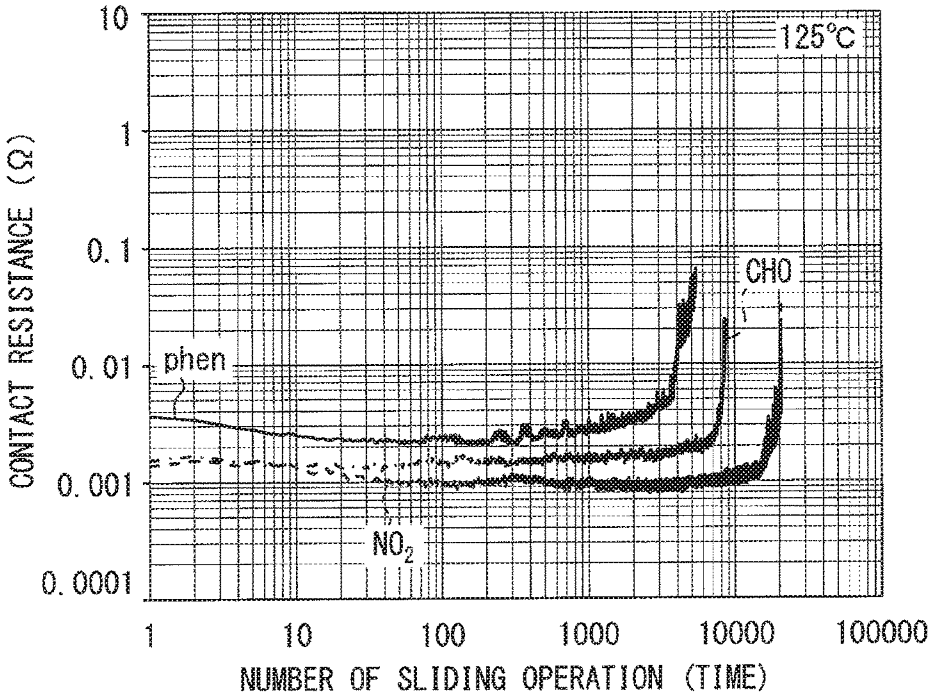
FIG. 16 is a diagram illustrating a relationship between the number of sliding operations and the contact resistance at high temperature in the example 2.
Figure 17:
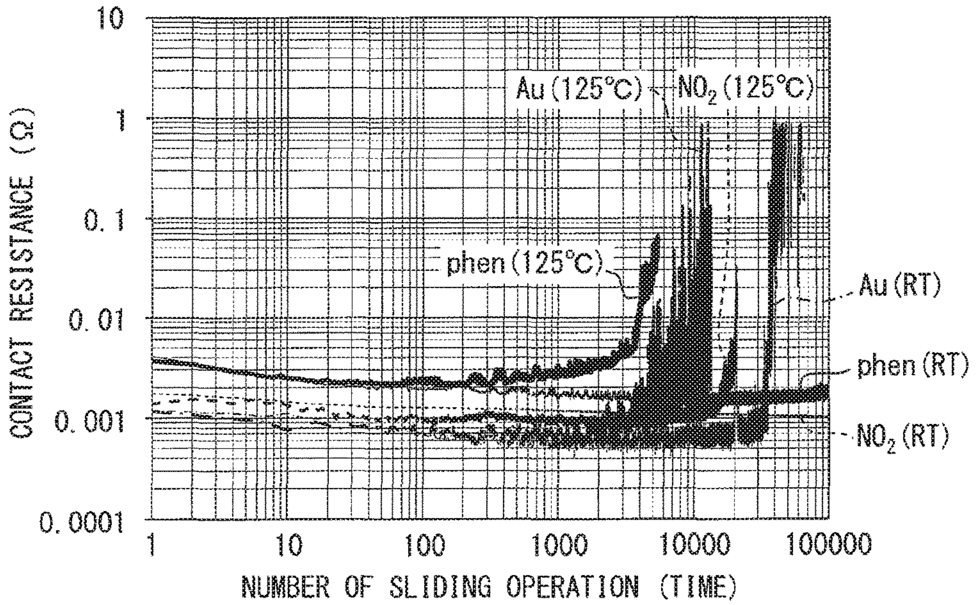
FIG. 17 is a diagram illustrating comparison results between the example 2 and a comparative example 2.

FIG. 15 shows the results of sliding experiments at room temperature. FIG. 16 shows the results of sliding experiments at 125 degrees Celsius. FIG. 17 shows the results of the example 2 employing phen and the phen derivative containing nitro group and the result of comparative example 2. In FIG. 15, the result with phen is shown by a solid line, the result with the phen derivative containing nitro group is shown by a broken line and the result with the phen derivative containing aldehyde group is shown by a dashed-dotted line. In FIG. 16, the result with phen is shown by a solid line, the result with the phen derivative containing nitro group is shown by a broken line and the result with the phen derivative containing aldehyde group is shown by a dashed-dotted line. In FIG. 17, the result with phen is shown by a solid line, the result with the phen derivative containing nitro group is shown by a broken line and the result with gold (Au) of the comparative example 2 is shown by a dashed-dotted line. In FIG. 17 the result at room temperature is shown by a thin line and the result at 125 degrees Celsius is shown by a bold line.

As shown in FIG. 15, at room temperature, the phen, the phen derivative containing electron withdrawing nitro group, the phen derivative containing electron withdrawing aldehyde group exhibit stable contact resistances at 50000 times of sliding operations.

As shown in FIG. 16, at 125 degrees Celsius, the phen, the phen derivative containing electron withdrawing nitro group, the phen derivative containing electron withdrawing aldehyde group exhibit stable contact resistances at 2000 times of sliding operations. Specifically, the phen exhibits stable resistances until around 2000 times of sliding operations. The phen derivative containing nitro group exhibits stable resistances until around 10000 times of sliding operations. The phen derivative containing aldehyde group exhibits stable resistances until around 7000 times of sliding operations. That is, the phen derivatives containing electron withdrawing group restricts the increase of contact resistance for a longer period of time than the phen. Although a kind of the substituted group is different, the phen derivative containing the electron withdrawing group at 5-position restricts the increase of the contact resistance for a longer period of time than the phen derivative containing the electron withdrawing group at 2-position.

As shown in FIG. 17, at room temperature, the phen restricts the increase of contact resistance for a longer period of time than the gold of the comparative example 2. At 125 degrees Celsius, the contact resistance is increased in phen slightly earlier than gold. On the other hand, the phen derivative containing electron withdrawing nitro group restricts the increase of the contact resistance for a longer period of time than gold at room temperature and at 125 degrees Celsius.

Accordingly, specific content of the aromatic compound 46 having pi-acceptability restricts the increase of the contact resistance for a long period of time. Especially, it is preferable to employ at least one of phen and phen derivatives as the aromatic compound 46. When the phen derivatives containing electron withdrawing groups are employed, the heat resistance is improved and the increase of the contact resistance is restricted for a long period of time in broader temperature range.

In the example 2, the phen and the phen derivatives containing the electron withdrawing groups are employed. However, similar results are assumed to be obtained with the bpy and the bpy derivatives containing the electron withdrawing groups. That is, it is preferable to employ at least one of bpy and bpy derivatives as the aromatic compound 46. It is more preferable to employ bpy derivatives containing at least one electron withdrawing group at 2 to 9-positions.

Example 3

Effects of reducing a kinetic friction force are examined.

Figure 18:
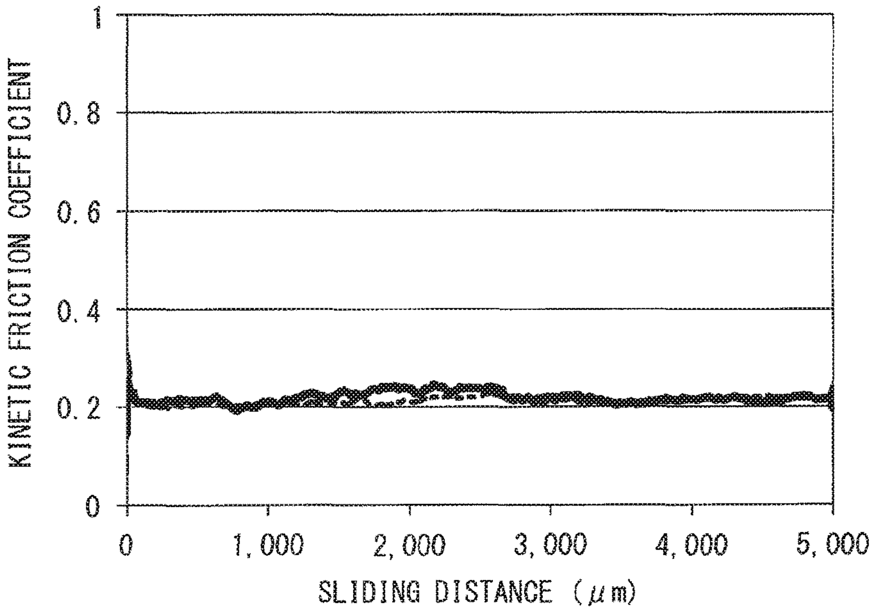
FIG. 18 is a diagram illustrating measurement results in an example 3.

The same experiment unit as the example 2 is employed. The first member 60 and the second member 61 are relatively slid in the direction orthogonal to the lamination direction, while applying a predetermined load (e.g., 50N) in the lamination direction from the side of the first member 60. During the sliding, a normal force N (i.e., applied load) and a kinetic friction force F are measured and kinetic friction coefficient μ is calculated from an equation of $F=\mu' N$. FIG. 18 shows calculation results of the kinetic friction coefficient μ. Two pairs of the first member 60 and the second member 61 are prepared, the kinetic friction coefficient μ is measured for each pair. In FIG. 18, one of the results is shown by a solid line, and the other one of the results is shown by a broken line.

As shown in FIG. 18, since the plating films include the specific content of aromatic compound 46, an average value of the kinetic friction coefficients μ is kept around 0.2. The kinetic friction coefficient between copper members is around 0.43.

That is, the aromatic compound 46 gives self-lubricity.

Second Embodiment

Second embodiment may refer to the first embodiment. Portions of the second embodiment that are common to the electronic device 10 of the first embodiment will not be repeatedly described.

Figure 19:
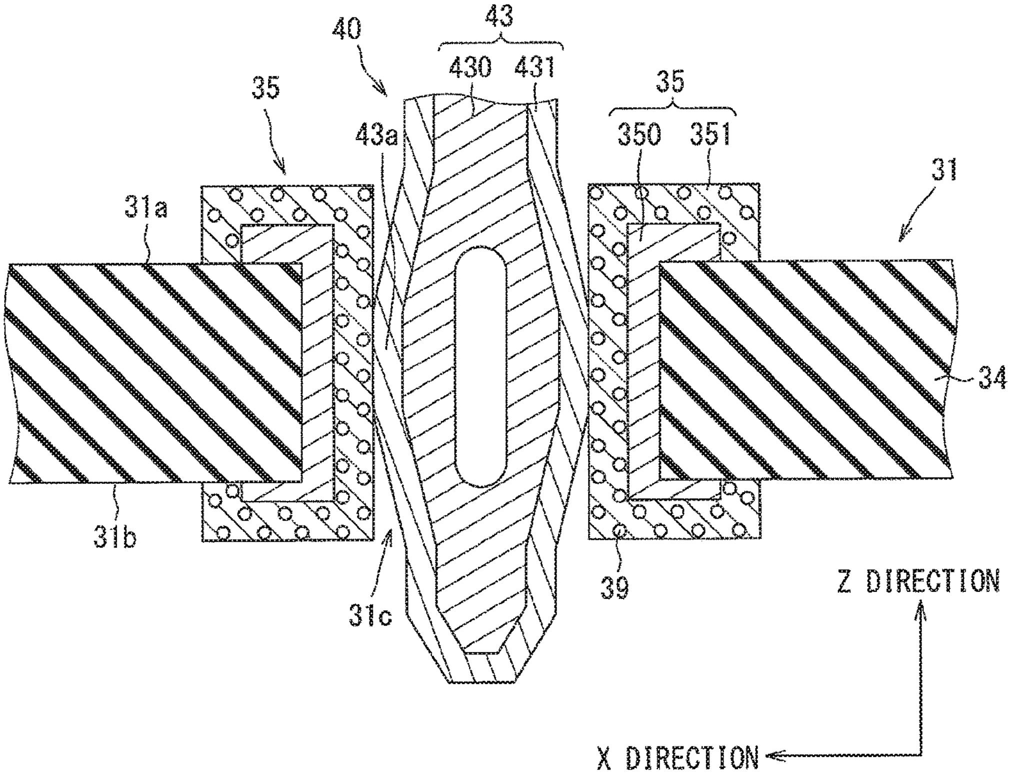
FIG. 19 is an enlarged cross-sectional view, corresponding to FIG. 2, of a circumference of an electrical connection portion between a terminal of a connector and a land of a print substrate of an electronic device according to a second embodiment.

In the present embodiment, as shown in FIG. 19, the land 35 that is the connection portion of the print substrate 31 includes a plating film 350 corresponding to the base, and a plating film 351 covering the base. In FIG. 19, illustrations of wirings other than the plating film 350 and 351 are omitted. The plating film 350 is made of copper. The plating film 350 is formed at the wall surface of the through hole 31*c*. The plating film 350 is also formed around the opening of the through hole 31*c*. The plating film 350 is formed by electroless copper plating.

The plating film 351 is formed on a surface of the plating film 350 as the base. The plating film 351 defines a surface of the land 35, namely, the plating film 351 defines a surface that is in contact with the terminal 43. The plating film 351 has the similar configuration to the above described plating films 431 and 451 including the aromatic compound 46. The plating film 351 includes an aromatic compound 39 in addition to metal of main constituent. The plating film 351 includes, as a main constituent, a metal that is capable of forming pi-backbonding with the aromatic compound 39 and capable of being formed into a film on the plating film 350. For example, the plating film 351 includes one of Ni, Cu, Ag or Co as the main constituent. In the present embodiment, the plating film 351 includes Cu.

Similarly to the above described aromatic compound 46, the aromatic compound 39 is a molecule that has aromaticity and pi-acceptability causing ligand field splitting equal to or greater than 2,2'-bipyridyl in spectrochemical series. For example, phen is employed as the aromatic compound 39. The content of the aromatic compound 39 in the plating film 351 is equal to or greater than 0.1 wt %, in terms of C atoms, with respect to the main metal of the plating film 351.

On the other hand, the plating film 431 of the terminal 43 of the connector 40 does not include the aromatic compound 46 and is made of noble metal. In the present embodiment, the plating film 431 is made of Au (i.e., gold). The plating film 431 may have a multilayer structure. In this case, the outermost layer is the noble metal plating.

Accordingly, in the present embodiment, the land 35 has the plating film 351 including the aromatic compound 39, and the terminal 43 is made of noble metal and has the plating film 431 defining the contact surface with the land 35. The land 35 corresponds to the first connection portion and the plating film 351 corresponds to the plating film having the aromatic compound. The connection portion 43*a* of the terminal 43 corresponds to the second connection portion, and the plating film 431 corresponds to a second plating film.

Figure 20A:
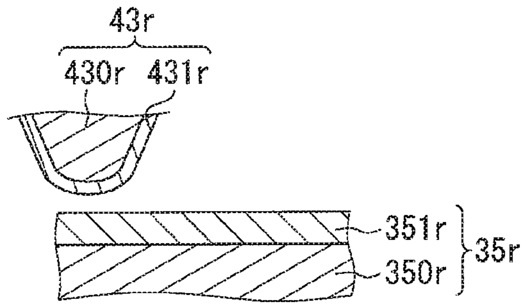
FIGS. 20A to 20C are cross-sectional views illustrating a reference example.
Figure 20B:
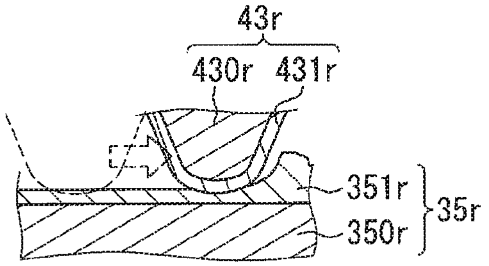
Figure 20C:
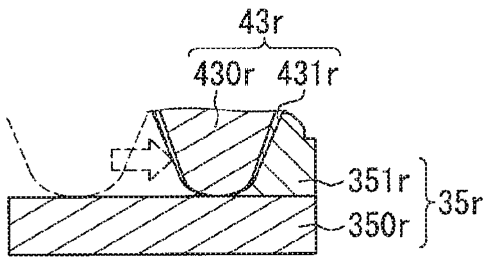
Figure 21A:
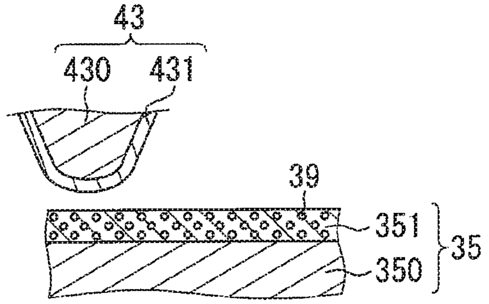
FIGS. 21A to 21C are cross-sectional views illustrating effects of the second embodiment.
Figure 21B:
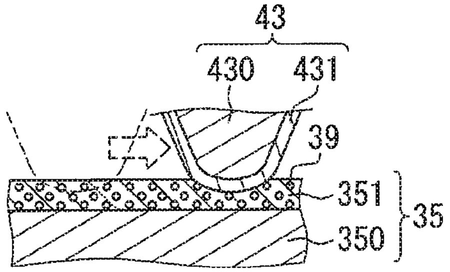
Figure 21C:
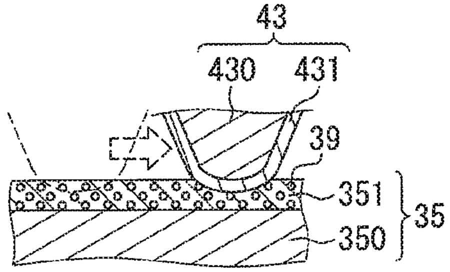

Next, effects of the electronic device 10 will be described with reference to FIGS. 20A to 20C and FIGS. 21A to 21C. FIGS. 21A to 21C are diagrams illustrating effects of the plating film 351 having self-lubricity. FIGS. 21A to 21C illustrate variation of a state of the plating films 351 and 431 when the terminal 43 is inserted into (i.e., pressed into) the through hole 31*c* for several times. FIG. 21A illustrates an initial state before the terminal 43 is pressed into the through hole 31*c*. FIG. 21B illustrates a state after the terminal 43 is pressed into the through hole 31*c*. FIG. 21C illustrates a state after the terminal 43 is pressed into the through hole 31*c* for several times. FIGS. 20A to 20C illustrate a reference example of a plating film 351*r* not having self-lubricity, and correspond to FIGS. 21A to 21C. Compared to FIG. 19, FIGS. 20A to 20C and FIGS. 21A to 21C are simply illustrated. In the reference example, elements that are common or relative to the elements of the present embodiment will be designated with symbols adding "r" to the symbols of the present embodiment.

As shown in FIG. 20A, in the reference example, a land 35*r* has a plating film 350*r* as the base and a plating film 351*r* covering the base. The plating film 351*r* does not include the aromatic compound 39. For example, the plating film 351*r* is made of Au. A terminal 43*r* has a base 430*r* and a plating film 431*r*. The plating film 431*r* does not include the aromatic compound 46. For example, the plating film 431*r* is made of Au.

When the terminal 43*r* is pressed into the through hole, an electrical connection point between the land 35*r* and the terminal 43*r* receives a load caused by a kinetic friction force between the plating films 351*r* and 431*r*, in addition to a load caused by a restoring force of the elastic deformation of the terminal 43*r*. As a result, when the terminal 43*r* is pressed into the through hole, the plating film 351*r* at the surface of the land 35*r* and the plating film 431*r* at the surface of the terminal 43*r* are scraped. As shown in FIG. 20B, after the terminal 43*r* is pressed into the through hole, thicknesses of the plating films 351*r* and 431*r* are thinner than those before the terminal 43*r* is pressed into the through hole.

As the insertion of the terminal 43*r* is repeated, the plating films 351*r* and 431*r* are scraped. As shown in FIG. 20C, after the insertion of the terminal 43*r* is repeated for several times, the plating films 351*r* and 431*r* are worn and the plating film 350*r* as the base is in contact with the base 430*r*. Since the plating film 350*r* and the base 430*r* are rubbed, the oxidation of the metal surface proceeds.

In the present embodiment, as shown in FIG. 21A, the plating film 351 of the land 35 includes the aromatic compound 39 and the content of the aromatic compound 39 in the plating film 351 is equal to or greater than 0.1 wt %, in terms of C atoms, with respect to the main metal of the plating film 351. That is, the plating film 351 has self-lubricity. The load caused by the kinetic friction force between the plating films 351 and 431 is smaller than that of the reference example. As a result, when the terminal 43 is pressed into the through hole 31*c*, the plating films 351 and 431 are less likely to be scraped. As shown in FIG. 21B, the thicknesses of the plating films 351*r* and 431*r* are not changed before and after the terminal 43 is pressed into the through hole 31*c*.

As shown in FIG. 21C, even after the terminal 43 is pressed into the through hole 31*c* for several times, the plating films 351 and 431 are less likely to be scraped. Since the attrition of the plating films 351 and 431 are restricted, the contact resistance is stably kept to be low.

Accordingly, in the present embodiment, the plating film 351 includes the specific content of aromatic compound 39. Since the plating film 351 has self-lubricity, the kinetic friction force is reduced and the amount of the attrition of the plating film 431, which is made of noble metal, is reduced. Conventionally, the plating film (i.e., noble metal plating) is scraped and the thickness of the plating film needs to be increased. In contrast, in the present embodiment, the thickness of the plating film may be decreased. Furthermore, in the present embodiment, as the kinetic friction force is decreased, the load of assembling caused by the kinetic friction force is decreased. Therefore, connection structure generating larger contact force (i.e., normal force) may be employed.

In the present embodiment, the plating film 431 is made of the noble metal and the plating film 351 includes the aromatic compound 39. However, the plating film 351 may be made of the noble metal and the plating film 431 may include the aromatic compound 46.

Other Embodiments

The electrical component having the plating film including the aromatic compound is not limited to the above examples. Electrical relay members such as terminals or leads may be employed as the electrical component. Electronic components having relay members may be employed as the electrical component. For example, a connection portion of a press-fit terminal electrically connecting two substrates may have the plating film including the aromatic compound. A connection portion of the terminal of the electronic component may have the plating film including the aromatic compound.

In the case of the electrical component having the relay member, at least a connection portion of the relay member has the plating film including the aromatic compound. The plating film including the aromatic compound may be disposed on a terminal of a card edge connector. The plating film including the aromatic compound may be disposed on a land of a print substrate that is in contact with the card edge connector.

Although an example is described in which the electronic device 10 includes two connectors 40 and 41, the present disclosure is not limited to the example. For example, the electronic device 10 may only include the connector 40 or the connector 41.

While only the selected exemplary embodiments and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments and examples according to the present disclosure is provided for illustration only, and not for the purpose of limiting the disclosure as defined by the appended claims and their equivalents.

What is claimed is:

1. An electrical component comprising:

a connection portion that is to be in contact with an other electrical component and is to establish an electrical connection with the other electrical component, wherein the connection portion includes a plating film that defines a surface of the connection portion, the plating film includes a metal as a main constituent and an aromatic compound that is dispersed in the plating film, the aromatic compound has pi-acceptability and causes ligand field splitting equal to or greater than that of 2, 2'-bipyridyl in spectrochemical series, a content of the aromatic compound in the plating film is equal to or greater than 0.1 weight percent, in terms of carbon atoms, with respect to the metal of the plating film, and the metal and the aromatic compound form pi-backbonding in the plating film.

2. The electrical component according to claim 1, wherein the aromatic compound includes a polycyclic compound containing a plurality of aromatic rings.

3. The electrical component according to claim 2, wherein the polycyclic compound includes a heterocyclic compound.

4. The electrical component according to claim 3, wherein the polycyclic compound includes at least one of 1, 10-phenanthroline and 1, 10-phenanthroline derivative.

5. The electrical component according to claim 4, wherein the 1, 10-phenanthroline derivative has an electron withdrawing group as a substituent group.

6. The electrical component according to claim 3, wherein the heterocyclic compound has an electron withdrawing group as a substituent group.

7. An electronic device comprising:

a first electrical component that includes a first connection portion;

a second electrical component that includes a second connection portion being in contact with the first connection portion and electrically connected to the first connection portion, wherein at least one of the first connection portion and the second connection portion includes a plating film that defines a contact surface between the first connection portion and the second connection portion, the plating film includes a metal as a main constituent and an aromatic compound that is dispersed in the plating film, the aromatic compound has pi-acceptability and causes ligand field splitting equal to or greater than that of 2, 2'-bipyridyl in spectrochemical series, a content of the aromatic compound in the plating film is equal to or greater than 0.1 weight percent, in terms of carbon atoms, with respect to the metal of the plating film, and the metal and the aromatic compound form pi-backbonding in the plating film.

8. The electronic device according to claim 7, wherein the first connection portion includes the plating film and the plating film is referred to as a first plating film, the second connection portion includes a second plating film that is in contact with the first plating film of the first connection portion, and the second plating film is made of a noble metal.

9. The electronic device according to claim 7, wherein one of the first electrical component and the second electrical component includes a press-fit terminal, the other one of the first electrical component and the second electrical component includes a substrate that has a through hole to receive the press-fit terminal, and the substrate has a corresponding one of the first connection portion and the second connection portion at a wall surface of the through hole.

10. The electronic device according to claim 7, wherein one of the first electrical component and the second electrical component includes a connector.

11. The electrical component according to claim 1, wherein the metal is a d-block transition metal.

12. The electrical component according to claim 1, wherein the pi-backbonding in the plating film is between a d-orbital of the metal and a pi-orbital of the aromatic compound.

13. The electrical component according to claim 11, wherein the pi-backbonding in the plating film is located between a d-orbital of the d-block transition metal and a pi-orbital of the aromatic compound.

14. The electrical component according to claim 1, wherein the metal is one or more metals selected from the group consisting of nickel, copper, gold, and cobalt.

15. The electronic device according to claim 7, wherein the metal is a d-block transition metal.

16. The electronic device according to claim 7, wherein the pi-backbonding in the plating film is between a d-orbital of the metal and a pi-orbital of the aromatic compound.

17. The electronic device according to claim 15, wherein the pi-backbonding in the plating film is between a d-orbital of the d-block transition metal and a pi-orbital of the aromatic compound.

18. The electronic device according to claim 7, wherein the metal is one or more metals selected from the group consisting of nickel, copper, gold, and cobalt.

* * * * *